US012329009B2

(12) United States Patent
Zhou et al.

(10) Patent No.: US 12,329,009 B2
(45) Date of Patent: Jun. 10, 2025

(54) OLED DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Yang Zhou, Hubei (CN); Yong Zhao, Hubei (CN); Mugyeom Kim, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 247 days.

(21) Appl. No.: 17/933,481

(22) Filed: Sep. 20, 2022

(65) Prior Publication Data

US 2023/0011359 A1 Jan. 12, 2023

Related U.S. Application Data

(63) Continuation of application No. 16/496,422, filed as application No. PCT/CN2019/077247 on Mar. 7, 2019, now Pat. No. 11,587,985.

(30) Foreign Application Priority Data

Dec. 29, 2018 (CN) .......................... 201811640213.5

(51) Int. Cl.
*H10K 59/35* (2023.01)
(52) U.S. Cl.
CPC ................................ *H10K 59/353* (2023.02)

(58) Field of Classification Search
CPC ............... H01L 27/3218; H01L 27/326; H01L 27/3216; H01L 27/3241; H10K 59/353; H10K 59/121; H10K 59/352; G09F 9/335
See application file for complete search history.

(56) References Cited

U.S. PATENT DOCUMENTS

2015/0054719 A1 2/2015 Lee
2018/0019288 A1* 1/2018 Yang ...................... H10K 59/40

FOREIGN PATENT DOCUMENTS

| CN | 104576690 A | 4/2015 |
| CN | 106972042 A | 7/2017 |

(Continued)

OTHER PUBLICATIONS

Notification to Grant Patent Right for Invention issued in corresponding Chinese Patent Application No. 201811640213.5 dated Jun. 6, 2022, pp. 1-6.

(Continued)

*Primary Examiner* — Thanhha S Pham
(74) *Attorney, Agent, or Firm* — PV IP PC; Wei Te Chung

(57) ABSTRACT

The present invention provides an organic light emitting diode (OLED) display panel. At least one light transmissive region used for placing photosensitive elements thereon is defined in a display region of the OLED display panel. Special-shaped sub-pixels are arranged at a periphery of each of the at least one light transmissive region. Each special-shaped sub-pixel includes at least one recess, and the at least one recess is at one side of the special-shaped sub-pixel facing a corresponding one of the at least one light transmissive region. An edge of each of the at least one recess conforms in shape to an edge of a corresponding one of the at least one light transmissive region.

19 Claims, 4 Drawing Sheets

(56) References Cited

FOREIGN PATENT DOCUMENTS

| | | | |
|---|---|---|---|
| CN | 107390422 | A | 11/2017 |
| CN | 107863448 | A | 3/2018 |
| CN | 108461060 | A | 8/2018 |
| CN | 108470748 | A | 8/2018 |
| CN | 108666348 | A | 10/2018 |
| CN | 108766990 | A | 11/2018 |
| CN | 108807487 | A | 11/2018 |
| CN | 108846354 | A | 11/2018 |
| CN | 108957832 | A | 12/2018 |
| JP | 2010230797 | A | 10/2010 |
| KR | 20170116556 | A | 10/2017 |

OTHER PUBLICATIONS

International Search Report in International application No. PCT/CN2019/077247, mailed on Sep. 30, 2019.
Written Opinion of the International Search Authority in International application No. PCT/CN2019/077247, mailed on Sep. 30, 2019.
Chinese Office Action issued in corresponding Chinese Patent Application No. 202210766034.6 dated Nov. 30, 2024, pp. 1-11.

* cited by examiner

OLED DISPLAY PANEL AND DISPLAY DEVICE

CROSS REFERENCE TO RELATED APPLICATION

This application is a continuation application of the co-pending application Ser. No. 16/496,422, filed on Sep. 21, 2019, which is a Notional Phase of PCT Patent Application No. PCT/CN2019/077247 having international filing date of Mar. 7, 2019, which claims priority to Chinese Patent Application with the application No. 201811640213.5, filed on Dec. 29, 2018 with the National Intellectual Property Administration, the disclosure of which is incorporated by reference in the present application in its entirety, and this application further relates to Chinese Patent Application with the application No. 202210766034.6, filed on Dec. 29, 2018 with the National Intellectual Property Administration.

1. FIELD OF DISCLOSURE

The present invention relates to a field of display devices and in particular, to an organic light emitting diode (OLED) display panel and a display device.

2. DESCRIPTION OF RELATED ART

Organic light emitting diode (OLED) displays are becoming mainstream in the display industry due to their wide viewing angles, high color gamut, and low power consumption. Industries aim to develop flexible and foldable OLED displays.

Nowadays, full-screen mobile phones have become mainstream on the market. While increasing a screen ratio, a space of a sensing region is also decreased. In order to obtain an optimal configuration of the sensing region, sensing elements of the sensing region are usually placed under a display panel. The display panel is provided with an opening which matches the sensing region, and the sensing elements are disposed in the opening. The sensing region is provided with a plurality of light transmissive holes for exposing photosensitive lenses, but this way, the opening at an edge of the display panel cannot display images, and the opening causes a decrease in a quantity of pixels in the display panel and lowers image quality of the display panel.

In summary, in conventional OLED display panels, setting a sensing region needs to sacrifice a large number of pixels, thereby reducing a display area of the display panel and reducing image quality of the display panel. Therefore, it is necessary to solve the existing problems in conventional techniques.

SUMMARY

The present invention provides an OLED display panel, in which pixels are disposed in a sensing region and outside light transmissive holes of the display panel, thereby increasing a display area of the display panel. The present invention solves existing problems in conventional display panels. The problems in the conventional display panels are that having a sensing region needs to sacrifice a large number of pixels, thereby reducing the display area of the display panel, and reducing image quality of the display panel.

Accordingly, the present invention provides solutions as follows.

The present invention provides an organic light emitting diode (OLED) display panel, including:
a display region;
at least one light transmissive region defined in the display region;
a plurality of special-shaped sub-pixels disposed at a periphery of each of the at least one light transmissive region;
wherein each of the special-shaped sub-pixels includes, at one side facing a corresponding one of the at least one light transmissive region, at least one recess, and an edge of each of the at least one recess conforms in shape to an edge of a corresponding one of the at least one light transmissive region.

According to one embodiment of the present invention, each of the at least one light transmissive region includes at least one curved edge protruding outwardly, and each of the special-shaped sub-pixels includes, at one side facing a corresponding one of the at least one curved edge, one curved recess.

According to one embodiment of the present invention, each of the at least one light transmissive region has a symmetrical shape about its center.

According to one embodiment of the present invention, a shape of each of the light transmissive regions is a circular shape or a parallelogram with rounded corners.

According to one embodiment of the present invention, an area of each of the special-shaped sub-pixels is equal to an area of each of a plurality of regular-shaped sub-pixels of the display region.

According to one embodiment of the present invention, the special-shaped sub-pixels surround the at least one light transmissive region, and the special-shaped sub-pixels are arranged along virtual horizontally extending lines and virtual perpendicularly extending lines connecting adjacent ones of the regular-shaped sub-pixels.

According to one embodiment of the present invention, each of the at least one light transmissive region has a circular shape, and the special-shaped sub-pixels are arranged at respective four ends of two orthogonal diameters of each of the at least one light transmissive region.

According to one embodiment of the present invention, at each of the four ends of the two orthogonal diameters is disposed one of the special-shaped sub-pixels, an arc length of one of the at least one recess of each special-shaped sub-pixel is substantially equal to one-fourth of a circumference of a corresponding one of the at least one light transmissive region.

According to one embodiment of the present invention, each of the at least one light transmissive region is a parallelogram with four rounded corners, and the special-shaped sub-pixels are disposed at respective ends of two diagonals of each of the at least one light transmissive region, or each of the special-shaped sub-pixels is disposed between each two adjacent ones of four ends of two diagonals of each of the at least one light transmissive region.

According to one embodiment of the present invention, at four diagonal ends or each two adjacent ones of the four diagonal ends of each of the at least one light transmissive region is disposed one of the special-shaped sub-pixels, and an arc length of one of the at least one recess of each special-shaped sub-pixel is substantially equal to one-fourth of a circumference of a corresponding one of the at least one light transmissive region.

According to one embodiment of the present invention, the display region includes two light transmissive regions disposed adjacent to each other, two special-shaped sub-pixels and one complementary-color sub-pixel between the two special-shaped sub-pixels are disposed on the same virtual horizontally extending line between the two light transmissive regions, and the complementary-color sub-pixel and the special-shaped sub-pixels at two sides thereof are of different colors.

According to one embodiment of the present invention, two of the special-shaped sub-pixels are disposed at each of four ends of the two orthogonal diameters, and an arc length of one of the at least one recess of each special-shaped sub-pixel is substantially one-twelfth of a circumference of a corresponding one of the at least one light transmissive region.

According to one embodiment of the present invention, a complementary-color sub-pixel is disposed between the two special-shaped sub-pixels at one end of the same diameter, and the complementary-color sub-pixel and the two special-shaped sub-pixels at two sides thereof are of different colors.

According to one embodiment of the present invention, the present invention provides a display device, including the OLED display panel of claim 1, the OLED display panel including:

the display region;

a sensing region positioned in the display region;

the at least one transmissive region positioned in the sensing region; and at least one photosensitive element disposed on a back side of the sensing region, the at least one photosensitive element being disposed corresponding to the at least one light transmissive region.

Advantages: The invention provides an OLED display panel, which expands an area of the pixels into the sensing region, and allows the pixels at the peripheries of the light transmissive regions to have ideal shapes, thereby increasing a display area of the display panel, improving the image quality of the display panel, and realizing a full screen. The present invention solves the existing problems in the conventional OLED display panel. Those problems are that a sensing region needs to sacrifice a large number of pixels, a display area of the conventional display panel is thus reduced, and image quality of the display panel is compromised.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

Embodiments of the present disclosure are described in detail with reference to the accompanying drawings as follows. Directional terms such as up/down, front/rear, right/left, inside/outside, and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

The present invention is directed to solving existing problems in conventional organic light emitting diode (OLED) display panels. The problems are that a sensing region needs to sacrifice a large number of pixels, thereby reducing a display area of the display panel and lowering image quality of display panel. The present invention can solve the problems.

Figure 1:
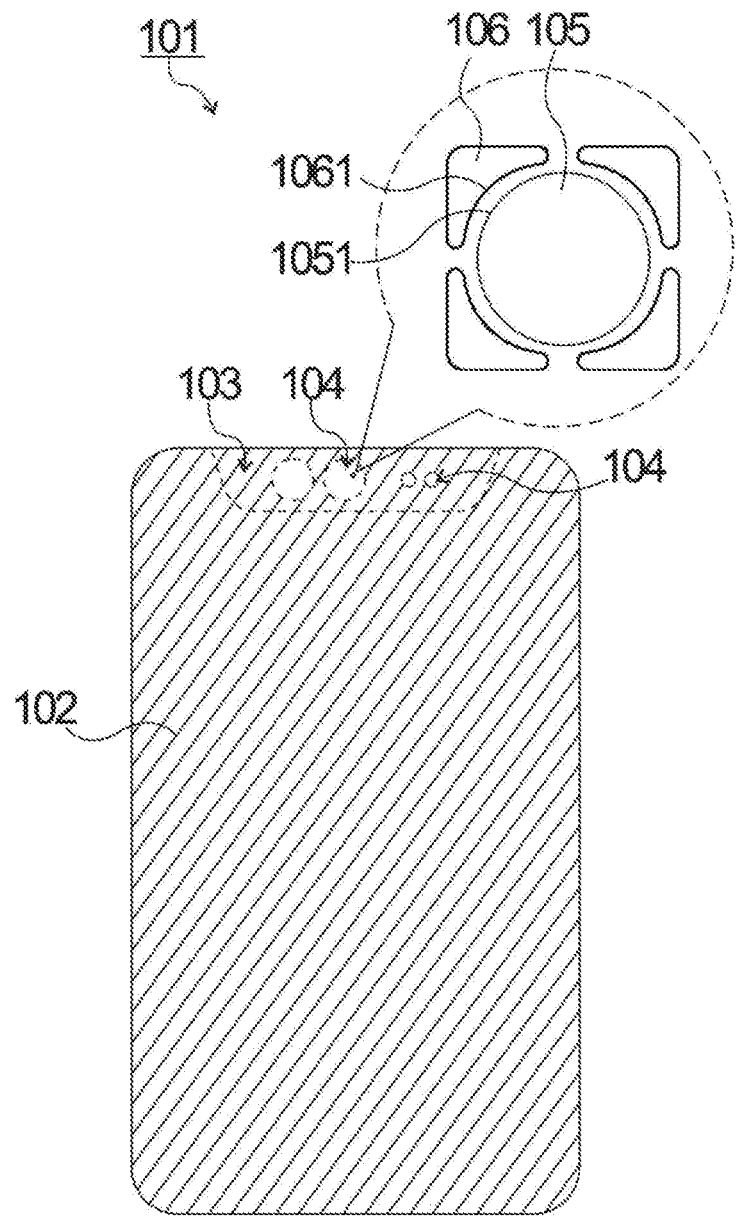
FIG. 1 is a schematic structural view illustrating an organic light emitting diode (OLED) display panel according to the present invention.

Referring to FIG. 1, the present invention provides an organic light emitting diode (OLED) display panel 101. The OLED display panel 101 includes a display region 102. A sensing region 103 positioned at an edge of the display region 102. At least one light transmissive region 105 is positioned in the sensing region 103. A sensor member is disposed on a back side of the sensing region 103. A photosensitive unit of the sensor member is disposed corresponding to the at least one light transmissive region 105. The at least one light transmissive region 105 is concentrated within multiple circular regions 104 of the sensing region 103. Sub-pixels are arrayed in the display region 102, the sensing region 103, and the circular regions 104, so that the display region 102, the sensing region 103, and the circular region 104 of the OLED display panel 101 can display images.

The sub-pixels positioned in the circular regions 104 are special-shaped sub-pixels 106 and are disposed at a periphery of each of the at least one light transmissive region 105. An edge 1061 of each of the special-shaped sub-pixels 106 conforms in shape to an edge 1051 of a corresponding one of the at least one light transmissive region 105. In other words, the edge 1061 of each of the special-shaped sub-pixels 106 has the same bending direction as the edge 1051 of a corresponding one of the at least one light transmissive region 105, and the bending curvature/bending angle is the same or similar. The edge 1061 of each special-shaped sub-pixel 106 is spaced apart from the edge 1051 of the corresponding light transmissive region 105 by a predetermined distance. The special-shaped sub-pixels 106 match the light transmissive regions 105, so that the sub-pixels have high conformity to the light transmissive regions 105, and a blank area at the edge 1051 of each light transmissive region 105 is filled to form a pixel, thereby optimally eliminating an image sawtooth at the edge 1051 of each light transmissive region 105, so that a displayed image of each circular region and a display image of other region are unified.

Each of the at least one light transmissive region 105 includes at least one curved edge protruding outwardly, and each of the special-shaped sub-pixels 106 includes one curved recess conforms in shape to the curved edge. An arc curvature of the recess of each special-shaped sub-pixel 106 is the same as or similar to an arc curvature of the curved edge of a corresponding one of the at least one light transmissive region 105, and the recess is disposed at one side of each special-shaped sub-pixel 106 facing the light transmissive region 105.

Each special-shaped sub-pixel 106 is different in shape from other sub-pixels in the sensing region 103 and the display region 102, but has the same area, so that a displayed image at a periphery of each of the at least one light transmissive region 105 and displayed images of other regions can be unified.

First Embodiment

Figure 2A:
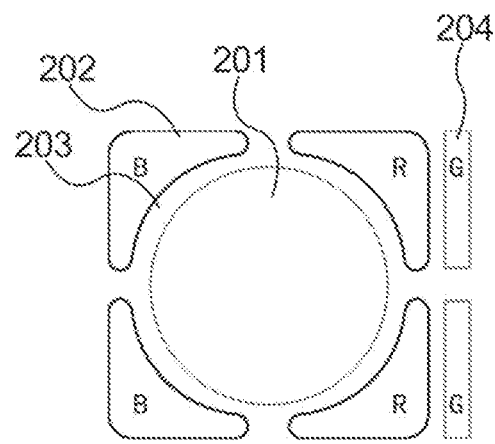
FIGS. 2A to 2E are schematic views illustrating a pixel structure according to a first embodiment of the present invention.

Referring to FIG. 2a, at least one light transmissive region 201 is disposed in the sensing region of the OLED display panel. A plurality of special-shaped sub-pixels 202 are disposed at the periphery of each of the at least one light transmissive region 201. Each of the special-shaped sub-pixels 202 includes, at one side facing a corresponding one of the at least one light transmissive region 201, at least one recess 203.

A contour of each of the at least one light transmissive region 201 is a circle formed by a closed arc. Around each of the at least one light transmissive region 201 is symmetrically distributed the special-shaped sub-pixels 202, and a shape of each of the at least one special-shaped sub-pixel 202 is approximately a right triangle. An oblique side of the right triangle is a circular arc to form the recess 203, and the oblique side is arranged facing the light transmissive region 201.

Two orthogonal (mutually perpendicular) diameters of each of the at least one light transmissive region 201 have four ends. Each of the special-shaped sub-pixels 202 is arranged corresponding to each of the four ends of the two orthogonal diameters of each of the at least one light transmissive region 201. Meanwhile, the special-shaped sub-pixels 202 are also required to satisfy another positional condition as follows. Please also refer to FIG. 3, regular-shaped sub-pixels 303 are disposed in arrays in the display region and the sensing region, and a shape of each of the regular-shaped sub-pixels 303 is a standard planar geometric shape. Virtual horizontally extending lines 3031 and virtual perpendicularly extending lines 3032 connecting the regular-shaped sub-pixels 303 are extended to the periphery of each of the at least one light transmissive region 201, the special-shaped sub-pixels 202 are located at intersections of the virtual horizontally extending lines 3031 and the virtual perpendicularly extending lines 3032.

In a case where an area of each of the special-shaped sub-pixels 202 is the same as an area of each of the regular-shaped sub-pixels in the display region and the sensing region, an arc length of an inner arc of each of the special-shaped sub-pixels 202 is approximately equal to one-fourth of a circumference of a corresponding one of the at least one light transmissive region 201, so that the special-shaped sub-pixels 202 surrounds the at least one light-transmissive region 201 to a greatest extent.

The sensing region is provided with the at least one light transmissive region 201.

When the sensing region is provided with one of the at least one light transmissive region 201, two rows of the special-shaped sub-pixels 202 are disposed around this light transmissive region 201. Each row of the special-shaped sub-pixels 202 is matched up with a complementary-color sub-pixel 204. The complementary-color sub-pixel 204 and the special-shaped sub-pixels 202 at the same row are different in color, so that the sub-pixels at the same row constitute one pixel unit.

For example, in the same row of sub-pixels, the complementary-color sub-pixel 204 is of a blue (B) color, the special-shaped sub-pixel 202 near the complementary-color sub-pixel 204 is of a red (R) color, and the special-shaped sub-pixel 202 adjacent to the red (R) special-shaped sub-pixel 202 is of a green (G) color.

Figure 2B:
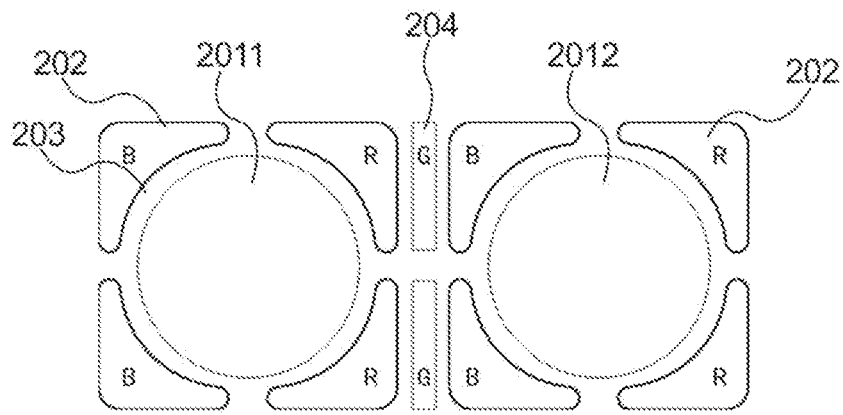

As shown in FIG. 2B, when the sensing region is provided with two light transmissive regions, for example, the sensing region is provided with a first light transmissive region 2011 and a second light transmissive region 2012, and the first light transmissive region 2011 and the first light transmissive region 2012 are positioned on the same horizontal line, have a same aperture diameter, and are disposed adjacent to each other. Two rows of sub-pixels are distributed around the first light transmissive region 2011 and the second light transmissive region 2012. Each row of sub-pixels includes two of the special-shaped sub-pixels 202 located between the first light transmissive region 2011 and the second light transmissive region 2012, a complementary-color sub-pixel 204 between the two special-shaped sub-pixels 202, the special-shaped sub-pixel 202 at the other side of the first light transmissive region 2011, and the special-shaped sub-pixel 202 at the other side of the second light transmissive region 2012. The complementary sub-pixel 204 and the special-shaped sub-pixels 202 at two sides thereof are different in color, and the special-shaped sub-pixels 202 adjacent to each other in the same row are also different in color. Accordingly, in the same row of the sub-pixels, the complementary sub-pixel 204 and the special-shaped sub-pixels 202 at two sides thereof constitute one pixel unit, or the complementary-color sub-pixel 204 and the special-shaped sub-pixels 202 on either side thereof constitute a pixel unit.

For example, in the same row of the sub-pixels, the complementary-color sub-pixel 204 is green (G), the special-shaped sub-pixel 202 at one side of the complementary-color sub-pixel 204 is red (R), and the special-shaped sub-pixel 202 at the other side of the complementary-color sub-pixel 204 is blue (B), the special-shaped sub-pixel 202 adjacent to the red special-shaped sub-pixel 202 is blue (B), and the special-shaped sub-pixel 202 adjacent to the blue special-shaped sub-pixel 202 is red (R).

For example, the complementary-color sub-pixel 204 is of a rectangular shape.

Figure 2C:
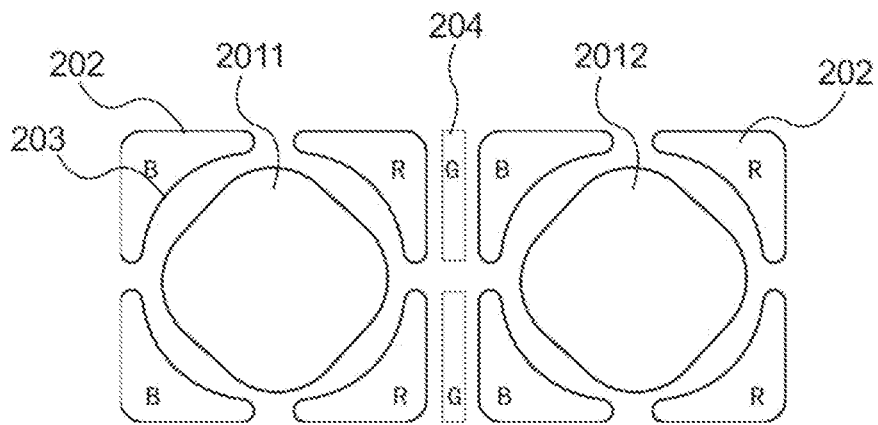

As shown in FIG. 2C, the sensing region of the OLED display panel is provided with a first light transmissive region 2011 and a second light transmissive region 2012, and the first light transmissive region 2011 and the second light transmissive region 2012 are positioned on the same horizontal line, have a same aperture diameter, and are disposed adjacent to each other. Two rows of the special-shaped sub-pixels 202 are distributed around the light transmissive region 2011 and the second light transmissive region 2012, and the complementary-color sub-pixel 204 is disposed in each row of the special-shaped sub-pixels 202.

FIG. 2C differs from FIGS. 2A and 2B in that a shape of the light transmissive region 201 is a parallelogram with rounded corners, and in detail, the shape of the light transmissive region 201 is a diamond with rounded corners.

The two diagonals of each light transmissive region 201 include four ends, and each of the special-shaped sub-pixels 202 is distributed between each adjacent two ends of the diagonals. An arc length of the recess 203 of each special-shaped sub-pixel 202 is approximately equal to one-fourth of a circumference of the corresponding light transmissive region 201.

The shape of each special-shaped sub-pixel 202, the position of each complementary-color sub-pixel 204, and a color distribution thereof are the same as those of FIG. 2A, so a detailed description is not repeated herein for brevity.

Figure 2D:
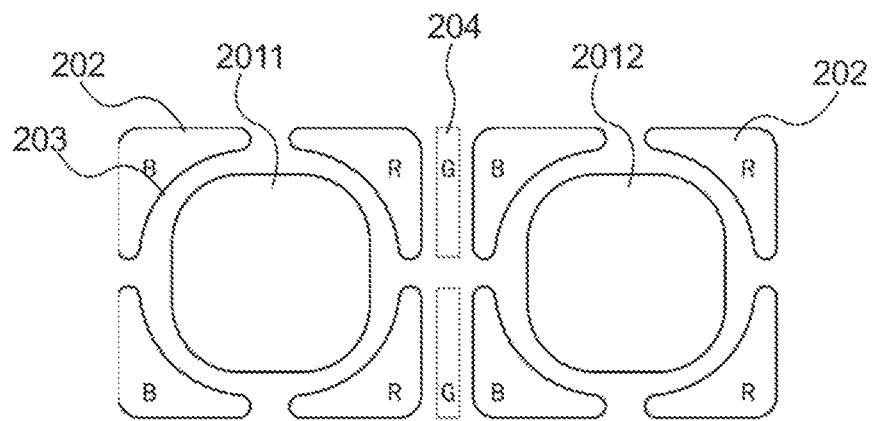

As shown in FIG. 2D, the sensing region of the OLED display panel is provided with a first light transmissive region 2011 and a second light transmissive region 2012, and the first light transmissive region 2011 and the second light transmissive region 2012 are positioned on the same horizontal line. The first light transmissive region 2011 and the second light transmissive region 2012 have a same aperture diameter and are adjacent to each other. Two rows of the special-shaped sub-pixels 202 are distributed around the first light transmissive region 2011 and the second light transmissive region 2012. A complementary-color sub-pixel 204 is disposed in each row of the special-shaped sub-pixels 202.

FIG. 2D is different from FIGS. 2A and 2B in that the shape of the light transmissive region 201 is a parallelogram with rounded corners, and in detail, the shape of the light transmissive region 201 is a square with rounded corners.

The two diagonals of each light transmissive region 201 have four ends, and each of the special-shaped sub-pixels 202 is distributed at each of the four ends of the two diagonals. An arc length of the recess 203 of each special-shaped sub-pixel 202 is approximately equal to one-fourth of a circumference of the corresponding light transmissive region 201.

The shape of each special-shaped sub-pixel 202, the position of each complementary-color sub-pixel 204, and a color distribution thereof are the same as those of FIG. 2A, so a detailed description is not repeated herein for brevity.

Figure 2E:
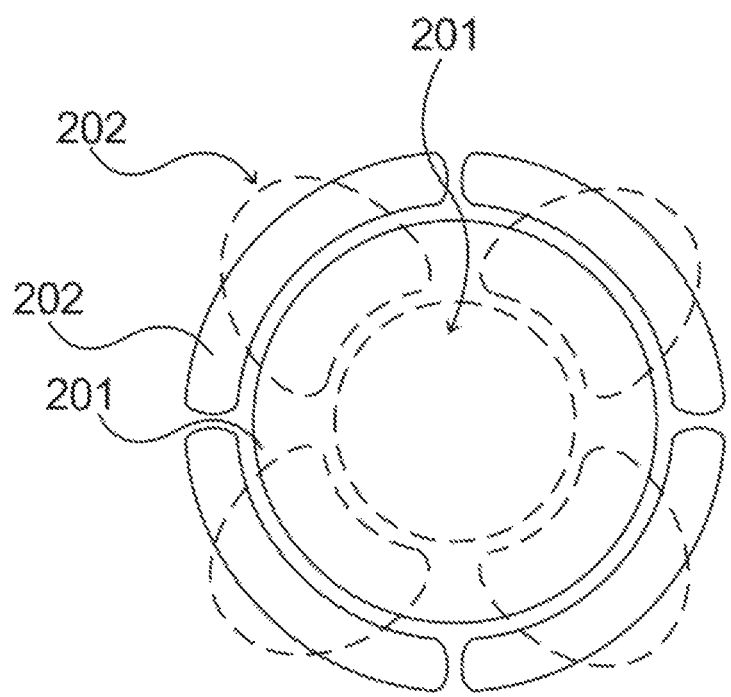

As shown in FIG. 2E, the sensing region of the OLED display panel is provided with the at least one light transmissive region 201, and the special-shaped sub-pixels 202 are distributed around the at least one light transmissive region 201.

Each of the at least one light transmissive region 201 has a circular shape. Two orthogonal diameters of each of the at least one light transmissive region 201 have four ends. One of the special-shaped sub-pixels 202 is arranged at each of the four ends of the two orthogonal diameters.

The shape of each special-shaped sub-pixel 202 is similar to an arch shape, and the special-shaped sub-pixel 202 includes an inner arc and an outer arc. The inner arc is located on one side of each special-shaped sub-pixel 202 facing the light transmissive region 201. The outer arc is located on one side of each special-shaped sub-pixel 202 away from the light transmissive region 201. An arc length of the inner arc of each special-shaped sub-pixel 202 is approximately equal to one-fourth of a circumference of the light transmissive region 201.

In a case where a ratio of the inner arc of each special-shaped sub-pixel 202 to the circumference of each of the light transmissive regions 201 of different aperture diameters is kept the same, the shape of each special-shaped sub-pixel 202 is changed by changing a curvature of the outer arc. This way, an area of each special-shaped sub-pixel 202 can be kept the same as an area of each regular-shaped sub-pixel. In the drawing, broken lines show the downsized light transmissive region and the deformed special-shaped sub-pixels.

Second Embodiment

Figure 3:
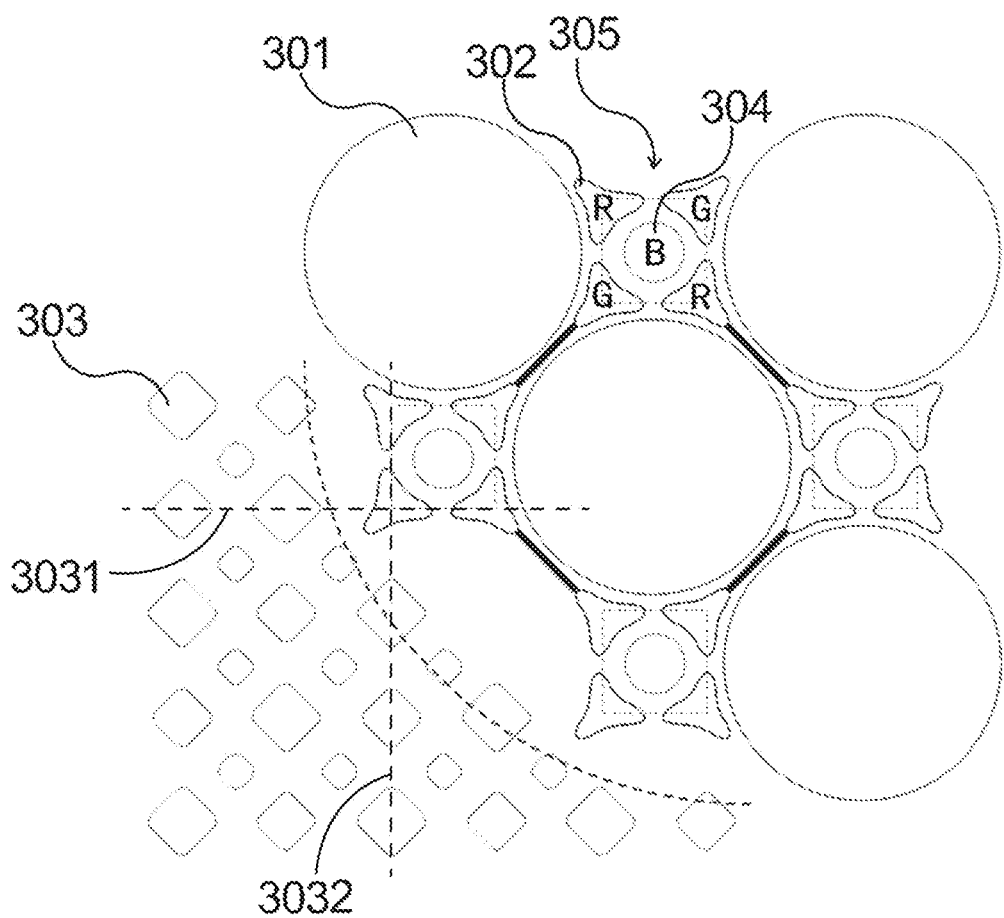
FIG. 3 is a schematic view illustrating the pixel structure according to a second embodiment of the present invention.

Referring to FIG. 3, the sensing region of the OLED display panel is provided with regular-shaped sub-pixels 303, light transmissive regions 301, and special-shaped sub-pixels 306 located at peripheries of the light transmissive regions 301. Each special-shaped sub-pixel 302 is provided with a recess on at least one side facing a corresponding one of the light transmissive regions 301.

Each light transmissive region 301 has a circular shape formed by a closed arc, and the special-shaped sub-pixels 302 is symmetrically distributed around the light transmissive regions 301. Two orthogonal (mutually perpendicular) diameters of the light transmissive region 301 have four ends, and two of the special-shaped sub-pixels 302 are disposed at positions corresponding to each of the four ends. An arc length of the recess of each special-shaped sub-pixel 302 is approximately equal to $\frac{1}{12}$ of a circumference of a corresponding one of the light transmissive regions 301.

A complementary-color sub-pixel 304 is disposed between the two special-shaped sub-pixels 302 at one end of the same diameter, and the complementary-color sub-pixel 304 and the two special-shaped sub-pixels 302 at two sides thereof are of different colors to thereby constitute a pixel unit 305.

A shape of each special-shaped sub-pixel 302 is similar to an equilateral triangle, and the three sides of the special-shaped sub-pixel 302 are disposed with the three recesses respectively for matching the light transmissive regions 301 which the recesses face respectively. At least one side of the special-shaped sub-pixel 302 matches the complementary-color sub-pixel 304, and the complementary-color sub-pixel 304 has a circular shape.

For example, the sensing region is provided with four light transmissive regions 301 of a same aperture diameter, which includes a central light transmissive region 301, and three light transmissive regions at three ends of diameters of the central light transmissive region 301, a pixel unit 305 is arranged between adjacent two of the light transmissive regions 301. Each of the pixel units 305 includes four of the special-shaped sub-pixels 302, arranged in an array, and each complementary-color sub-pixel 304 is located at a center of each four of the special-shaped sub-pixels 302. In the same row and in the same column of the sub-pixels, the adjacent special-shaped sub-pixels 302 are of different colors, and the special-shaped sub-pixels 302 and the complementary-color sub-pixel 304 are of different colors.

For example, the complementary-color sub-pixel 304 is blue (B), and the special-shaped sub-pixels 302 around each complementary-color sub-pixel 304 is red (R) and green (G) arranged alternately.

According to the above objectives of the present invention, the display device is provided, including the OLED display panel of the first embodiment and the second embodiment. The OLED display panel includes a display region, a sensing region located in the display region, and a light transmissive region. At least one photosensitive element is disposed on a back side of the sensing region, and a photosensitive unit of the photosensitive element is disposed corresponding to the light transmissive region.

Specific principles of the display device of the present invention are the same as or similar to the above descriptions in the preferable embodiments of the OLED display panel. For details, refer to the related descriptions in the preferable embodiments of the liquid crystal display panel, and a detailed description is not repeated herein for brevity.

The OLED display panel of the present invention expands an area of the pixels into the sensing region, allows the pixel units at the peripheries of the light transmissive regions to have an ideal shape, thereby increasing a display area of the display panel and improving image quality of the display panel. In conventional OLED display panels, setting a sensing region requires sacrificing a large number of pixels, which causes reduction in a display area of the conventional display panel and lowers image quality of the display panel.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. An organic light emitting diode (OLED) display panel, comprising:
    a display region, wherein multiple sub-pixels are arranged in an array in the display region; and
    a sensing region, wherein a plurality of pixel units are arranged in an array in the sensing region, the pixel units in the sensing region are sensing-region pixel units located within the sensing region, and a plurality of light transmissive regions are arranged among the pixel units;
    wherein the pixel units comprise a plurality of special-shaped sub-pixels, and each of the special-shaped sub-pixels has a shape different from any of the sub-pixels in the display region,
wherein each of the special-shaped sub-pixels comprises a recessed side, and the recessed side is disposed at one side of the special-shaped sub-pixel facing one of the light transmissive regions.

2. The OLED display panel according to claim 1, wherein the pixel units in the sensing region further comprise regular-shaped sub-pixels, and the special-shaped sub-pixels are disposed at two sides of each of the regular-shaped sub-pixels.

3. The OLED display panel according to claim 2, wherein the regular-shaped sub-pixels are green sub-pixels, and the special-shaped sub-pixels are red sub-pixels and blue sub-pixels.

4. The OLED display panel according to claim 2, wherein each of the regular-shaped sub-pixels is rectangular-shaped or circular-shaped.

5. The OLED display panel according to claim 2, wherein a contour of each of the special-shaped sub-pixels comprises two mutually perpendicular sides and one of the recessed sides, and one of the two mutually perpendicular sides faces one of the regular-shaped sub-pixels.

6. The OLED display panel according to claim 2, wherein in each of the pixel units in the sensing region, an area of each of the special-shaped sub-pixels is larger than an area of each of the regular-shaped sub-pixels.

7. The OLED display panel according to claim 1, wherein each of the recessed sides is spaced from an edge of a corresponding one of the light transmissive regions.

8. The OLED display panel according to claim 1, wherein each of the recessed sides conforms in shape to an edge of a corresponding one of the light transmissive regions.

9. The OLED display panel according to claim 8, wherein each of the light transmissive regions has a symmetrical shape about its center.

10. The OLED display panel according to claim 1, wherein the pixel units in the sensing region are arranged as an island chain in the sensing region, and a spacing between any two adjacent pixel units is equal.

11. The OLED display panel according to claim 10, wherein the pixel units in the sensing region are grouped into multiple pixel unit groups with a square-shaped or diamond-shaped arrangement in the sensing region, and each of the light transmissive regions is located in one of the pixel unit group with the square-shaped or diamond-shaped arrangement.

12. The OLED display panel according to claim 11, wherein a minimum one of the pixel unit groups is a combination of four of the pixel units, and the four of the pixel units form an enclosing pattern surrounding one of the light transmissive regions.

13. The OLED display panel according to claim 2, wherein an edge of each of the regular-shaped sub-pixels conforms in shape to an edge of the adjacent special-shaped sub-pixel; and
    an edge of each of the special-shaped sub-pixels conforms in shape to an edge of the adjacent light transmissive region.

14. The OLED display panel according to claim 13, wherein each of the pixel units in the sensing region comprises the regular-shaped sub-pixels and the special-shaped sub-pixels, and wherein the regular-shaped sub-pixels and the special-shaped sub-pixels are arranged in rows or columns, and the adjacent pixel units share the special-shaped sub-pixels.

15. The OLED display panel according to claim 13, wherein each of the pixel units in the sensing region comprises one regular-shaped sub-pixel and special-shaped sub-pixels, and wherein the regular sub-pixel is located at an inner side of the pixel unit, and the special-shaped sub-pixels are located at an outer side of the regular sub-pixels and are disposed close to one of the light transmissive regions.

16. The OLED display panel according to claim 15, wherein each of the pixel units comprises sub-pixels of at least three colors, wherein one or more of the sub-pixels are provided for each of the at least three colors, and the sub-pixel located at the inner side of the pixel unit is not of the same color as the sub-pixels at two sides.

17. The OLED display panel according to claim 16, wherein in one pixel unit, one or more of the sub-pixels of the same color are arranged in a diagonal with respect to the sub-pixel located at the inner side of the pixel unit.

18. The OLED display panel according to claim 1, wherein a boundary pixel region is defined between the display region and the sensing region, and pixel units in the boundary pixel region are arranged in an oblique direction.

19. A display device, comprising the OLED display panel of claim 1.

* * * * *